US006207349B1

(12) United States Patent
Lewis

(10) Patent No.: US 6,207,349 B1
(45) Date of Patent: Mar. 27, 2001

(54) LITHOGRAPHIC IMAGING WITH CONSTRUCTIONS HAVING MIXED ORGANIC/INORGANIC LAYERS

(75) Inventor: Thomas E. Lewis, East Hampstead, NH (US)

(73) Assignee: Presstek, Inc., Hudson, NH (US)

( * ) Notice: Subject to any disclaimer, the term of this patent is extended or adjusted under 35 U.S.C. 154(b) by 0 days.

(21) Appl. No.: 09/272,654

(22) Filed: Mar. 18, 1999

Related U.S. Application Data

(60) Provisional application No. 60/079,021, filed on Mar. 23, 1998.

(51) Int. Cl.[7] ................................ G03F 7/16; G03F 7/20; G03F 7/36; B41M 1/06; B41M 5/025

(52) U.S. Cl. ........................ 430/302; 430/303; 430/271.1; 101/470; 101/465; 101/458; 101/459; 101/460

(58) Field of Search ................................ 430/271.1, 302, 430/303; 101/458, 459, 460, 470, 465

(56) References Cited

U.S. PATENT DOCUMENTS

| | | | |
|---|---|---|---|
| 4,482,622 | 11/1984 | Soden et al. | 430/135 |
| 4,490,774 | 12/1984 | Olson et al. | 361/311 |
| 4,647,818 | 3/1987 | Ham | 315/111.21 |
| 4,696,719 | 9/1987 | Bischoff | 202/205 |
| 4,842,893 | 6/1989 | Yializis et al. | 427/44 |
| 4,883,731 | 11/1989 | Tam et al. | 430/41 |
| 4,954,371 | 9/1990 | Yializis | 427/44 |
| 5,032,461 | 7/1991 | Shaw et al. | 428/461 |
| 5,102,756 | 4/1992 | Vincett et al. | 430/41 |
| 5,260,095 | 11/1993 | Affinito | 427/124 |
| 5,395,644 | 3/1995 | Affinito | 427/124 |
| 5,440,446 | 8/1995 | Shaw et al. | 361/301.5 |
| 5,547,508 | 8/1996 | Affinito | 118/50 |
| 5,681,615 | 10/1997 | Affinito et al. | 427/255.6 |
| 5,704,291 * | 1/1998 | Lewis | 430/302 |
| 5,807,658 * | 9/1998 | Ellis et al. | 430/302 |

FOREIGN PATENT DOCUMENTS

| | | |
|---|---|---|
| 0490051A1 | 6/1992 | (EP) . |
| 0664211A2 | 7/1995 | (EP) . |
| 0787583A2 | 8/1997 | (EP) . |

OTHER PUBLICATIONS

Affinito et al., "Polymer/Polymer, Polymer/Oxide, and Polymer/Metal Vacuum Deposited Interference Filters," *Tenth Int'l Vacuum Web Coating Conf.* (1996).

Affinito et al., "Vacuum Deposition of Polymer Electrolytes on Flexible Substrates," *Ninth Int'l Vacuum Web Coating Conf.* (1995).

Affinito et al., "Polymer–Oxide Transparent Barrier Layers," *SVC 39th Ann. Tech. Conf.* (1996).

Affinito et al., "Comparison of Surface Treatments of PET and PML," *SVC 40th Ann. Tech. Conf.* (1997).

Affinito et al., "PML/Oxide/PML Barrier Layer Performance Differences Arising from Use of UV or Electron Beam Polymerization of the PML Layers," *ICMCTF97 Conf.* (1997).

* cited by examiner

*Primary Examiner*—Janet Baxter
*Assistant Examiner*—Sin J. Lee
(74) *Attorney, Agent, or Firm*—Cesari and McKenna, LLP

(57) ABSTRACT

The effects of interfacial transition between organic and inorganic layers of a lithographic printing member are ameliorated by incorporating an inorganic component within the matrix of the organic layer. In a first aspect, a lithographic printing plate having adjacent organic and inorganic layers is fabricated by depositing a curable polymer, softening the polymer, and integrating an inorganic material therewith. The polymer is then cured to immobilize the integrated deposition material, and the desired inorganic layer is applied over the deposited inorganic material (and any exposed portions of the polymer). In a second aspect, a graded structure is built up on a substrate in successive deposition steps. Both polymer precursors and an inorganic filler material are deposited in stages, with each stage containing a desired ratio of polymer to filler.

32 Claims, 1 Drawing Sheet

LITHOGRAPHIC IMAGING WITH CONSTRUCTIONS HAVING MIXED ORGANIC/INORGANIC LAYERS

RELATED APPLICATION

This application stems from U.S. Provisional Application Ser. No. 60/079,021, filed Mar. 23, 1998.

BACKGROUND OF THE INVENTION

1. Field of the Invention

The present invention relates to digital printing apparatus and methods, and more particularly to imaging of lithographic printing-plate constructions on- or off-press using digitally controlled laser output.

2. Description of the Related Art

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. Dry printing systems utilize printing members whose ink-rejecting portions are sufficiently phobic to ink as to permit its direct application. Ink applied uniformly to the printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

In a wet lithographic system, the non-image areas are hydrophilic, and the necessary ink-repellency is provided by an initial application of a dampening (or "fountain") solution to the plate prior to inking. The ink-abhesive fountain solution prevents ink from adhering to the non-image areas, but does not affect the oleophilic character of the image areas.

To circumvent the cumbersome photographic development, plate-mounting and plate-registration operations that typify traditional printing technologies, practitioners have developed electronic alternatives that store the imagewise pattern in digital form and impress the pattern directly onto the plate. Plate-imaging devices amenable to computer control include various forms of lasers. For example, U.S. Pat. Nos. 5,351,617 and 5,385,092 (the entire disclosures of which are hereby incorporated by reference) describe an ablative recording system that uses low-power laser discharges to remove, in an imagewise pattern, one or more layers of a lithographic printing blank, thereby creating a ready-to-ink printing member without the need for photographic development. In accordance with those systems, laser output is guided from the diode to the printing surface and focused onto that surface (or, desirably, onto the layer most susceptible to laser ablation, which will generally lie beneath the surface layer).

U.S. Ser. Nos. 08/700,287 and 08/756,267, the entire disclosures of which are hereby incorporated by reference, describe a variety of lithographic plate configurations for use with such imaging apparatus. In general, the plate constructions include an inorganic layer (i.e., a metal, combination of metals, or a metal/non-metal compound) situated on an organic polymeric layer. The inorganic layer ablates in response to imaging (e.g., infrared, or "IR") radiation. In one approach, the inorganic layer represents the topmost surface of the plate and accepts fountain solution, while the underlying polymeric layer accepts ink. In another approach, the inorganic layer serves only a radiation-absorption (rather than a lithographic) function, with the underlying layer accepting ink and an overlying layer either rejecting ink or accepting fountain solution. Ablation of the inorganic layer by an imaging pulse generally weakens the topmost layer as well, and this, combined with disruption of its anchorage (due to disappearance of the ablated inorganic layer), renders the topmost layer easily removable in a post-imaging cleaning step. With either of these two approaches, application of an imaging pulse to a point on the plate ultimately creates an image spot having an affinity for ink or an ink-abhesive fluid differing from that of unexposed areas, the pattern of such spots forming a lithographic plate image.

These types of plates can pose manufacturing challenges, as well as performance limitations, owing to the abrupt transition between an inorganic layer and an organic, polymeric layer. The divergent physical and chemical characteristics of such distinct layers can compromise their anchorage to one another—a critical performance requirement—as well as the durability of the inorganic layer. For example, because inorganic and organic materials typically have very different coefficients of thermal expansion and elastic moduli, even perfectly adhered inorganic layers may undergo failure (e.g., fracturing) due to temperature variations or the stress of plate manipulation and use. The different responses of two adjacent layers to an external condition can easily cause damage that would not occur in either layer by itself.

To improve interlayer anchorage, polymeric layers may be selected (or applied as intermediate coatings) based on chemical compatibility with inorganic material. A polymeric layer may also be pretreated (e.g., through plasma exposure) to modify the surface for greater interfacial compatibility with a subsequently applied inorganic layer. These approaches, however, have limited utility in addressing the effects of transition between fundamentally different materials.

DESCRIPTION OF THE INVENTION

Brief Summary of the Invention

The present invention reduces the abruptness of interfacial transition by altering the effective properties of the organic layer (to which the inorganic layer is applied) by incorporating an inorganic component within the matrix of the organic layer. In a first aspect, the invention comprises a method of fabricating a lithographic printing plate having adjacent organic and inorganic layers. A first layer comprising a curable polymer is softened, and an inorganic material—compatible with or, in some cases, compositionally identical to—the soon-to-be-applied inorganic layer is deposited onto a surface of the softened polymer. The inorganic material overspreads the surface and integrates within the soft polymeric layer; at this point, it may be desirable to assist the migration of the inorganic material into the polymer (e.g., by charging the inorganic material and applying an opposite charge to a conductor underlying the polymer). The polymer is then cured to immobilize the integrated deposition material, thereby forming a composite, and the desired inorganic layer is applied over the deposited inorganic material (and any exposed portions of the polymer). This second inorganic layer, and possibly the previously deposited inorganic material as well, is subject to ablative removal by exposure to laser radiation. The second inorganic layer and the organic/inorganic composite have different affinities for ink and/or an ink-abhesive fluid. The inorganic layer may, for example, be a metallic inorganic material as disclosed in the '287 and '267 applications. Despite the introduction of such an inorganic material within the matrix of the polymer, the natural affinity characteristics (e.g., oleophilicity) of the polymer may be retained. For example, while the inorganic phase may have a pronounced effect on the stiffness and heat-transport properties of the composite, thereby enhancing physical compatibility with a pure inorganic layer, it may not significantly affect surface energy (so that the composite retains the the affinity for ink and/or an ink-abhesive fluid that characterized the original polymer).

The deposition material may fully cover the surface of the polymeric material, forming a continuous layer thereover, or may instead form an intermittent pattern over the surface. In the former case, imaging radiation may remove both the second inorganic layer and the the deposition material from the polymer to expose the surface of the composite.

The polymer is generally chosen both for its lithographic affinity characteristics and also for its ability to be cured into a rigid, three-dimensional structure that permanently immobilizes the inorganic deposition material. Not suitable for the present invention are polymeric materials that exhibit a low glass-transition temperature (which permits repeated, temperature-dependent transitions between soft and rigid states) unless provided with crosslinking groups that facilitate permanent cure (and thereby defeat further phase transitions). In a preferred embodiment, the polymer comprises an acrylic polymer combined with a multifunctional acrylate monomer, which are crosslinked following deposition of the inorganic material. Acrylates, like many inorganic deposition materials, can be deposited under vacuum, permitting the entire fabrication process to be carried out in a single operation.

In general, the deposition material will be ink-receptive and the second layer hydrophilic. This need not be the case, however, nor do these affinity characteristics mandate a wet plate. For example, as described in the '287 application, the second layer can underlie a topcoat having a different affinity characteristic. Ablation of the second layer disrupts the anchorage of the topcoat, rendering it easily removed in a post-imaging cleaning step to reveal the deposition material (and possibly the polymeric layer as well). The topcoat may be silicone or a fluoropolymer in the case of a dry plate, or a hydrophilic polymer if a polymer-topcoated wet plate is desired, of course, application of a polymeric layer over the inorganic second layer raises the same compatibility issues resolved through use of the inorganic deposition material.

In a second aspect, a graded structure is built up on a substrate in successive deposition steps. Both polymer precursors and an inorganic filler material are deposited in stages, with each stage containing a desired ratio of polymer to filler. In a preferred embodiment, the proportion of filler increases in each stage, resulting in a concentration gradient with the amount of filler increasing away from the substrate. The polymer precursors may be cured after each stage of deposition, permanently immobilizing the distribution of organic and inorganic material. A top layer is applied over a surface of the structure, the top layer and the surface having different affinities for ink and/or an ink-abhesive fluid. The top layer, but not the underlying graded structure, may be subject to ablative removal by exposure to laser radiation.

The polymer precursor and the filler material may be deposited as a vapor or as a liquid. In one embodiment, the precursor is an acrylic polymer combined with a multifunctional acrylate monomer, the curing step crosslinking the monomers with the polymer. Once again, the structure is typically oleophilic and the deposited inorganic layer hydrophilic, but the result need not be a wet plate.

In use, a printing plate in accordance with the invention is selectively exposed, in a pattern representing an image, to imaging radiation (emanating, for example, from one or more lasers whose output is scanned over the surface of the plate) so as to ablate selected portions of the inorganic layer and, possibly, exposed portions of the deposition material, thereby directly producing an array of image features. Ink is applied to the plate and transferred to a recording medium in the conventional fashion. As used herein, the term "plate" or "member" refers to any type of printing member or surface capable of recording an image defined by regions exhibiting differential affinities for ink and/or fountain solution; suitable configurations include the traditional planar lithographic plates that are mounted on the plate cylinder of a printing press, but can also include cylinders (e.g., the roll surface of a plate cylinder), an endless belt, or other arrangement.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
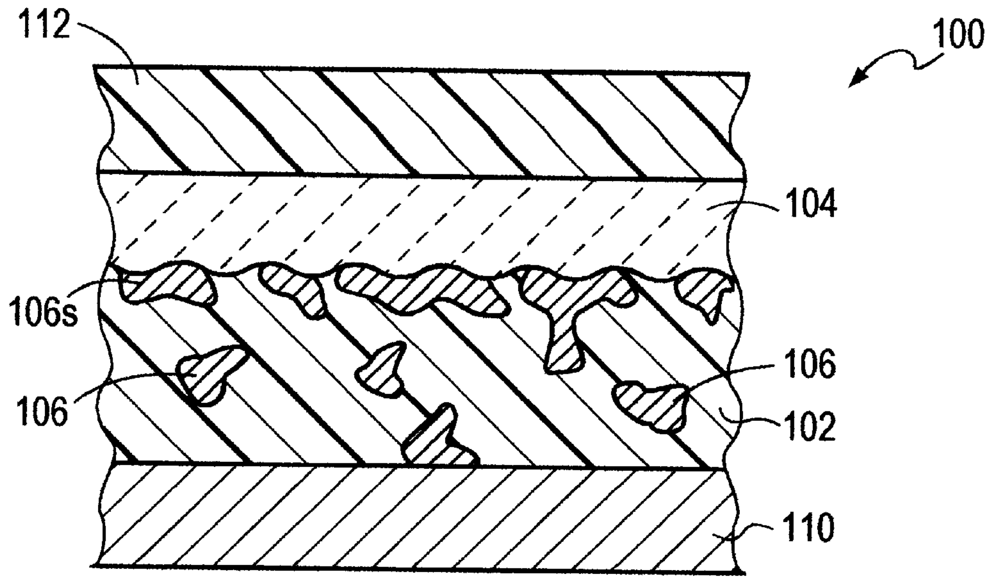
FIG. 1 is an enlarged sectional view of a lithographic plate having a mixed organic/inorganic substrate, an inorganic layer thereover, and an optional topmost polymeric layer.

Imaging apparatus suitable for use in conjunction with the present printing members includes at least one laser device that emits in the region of maximum plate responsiveness, i.e., whose $lambda_{max}$ closely approximates the wavelength region where the plate absorbs most strongly. Specifications for lasers that emit in the near-IR region are fully described in the '617 and '092 patents (the entire disclosure of which is hereby incorporated by reference); lasers emitting in other regions of the electromagnetic spectrum are well-known to those skilled in the art.

Suitable imaging configurations are also set forth in detail in the '617 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintains the beam output at a precise orientation with respect to the plate surface, scans the output over the surface, and activates the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor (RIP) or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, it is generally preferable (for on-press applications) to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid plate movement (e.g., through use of high-speed motors) and thereby utilize high laser pulse rates, can frequently utilize a single laser as an imaging source.

Figure 2:
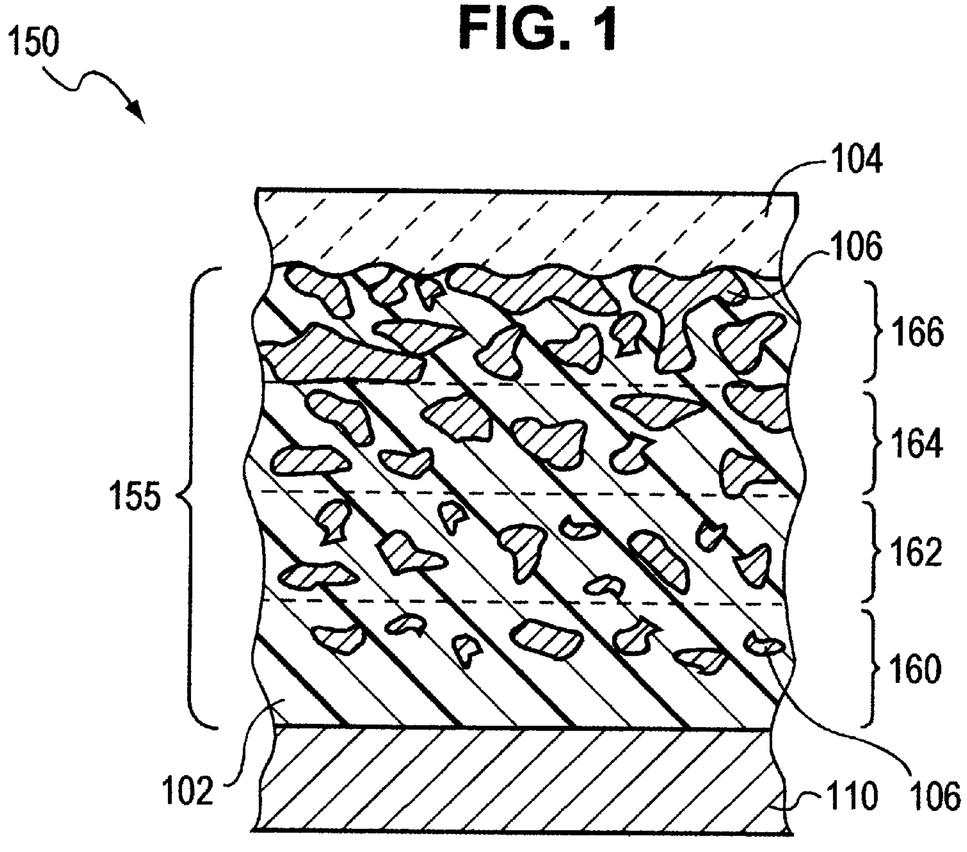
FIG. 2 is an enlarged sectional view of a lithographic plate having a graded organic/inorganic substrate and an inorganic layer thereover.

Representative printing members in accordance with the present invention are illustrated in FIGS. 1 and 2. In FIG. 1, a printing plate 100 comprises a polymeric layer 102 and an inorganic layer 104. A deposition material 106 is integrated within the matrix of polymer 102 and, covering all or much of the entire top surface thereof, provides a transition layer 106*s* between layers 102 and 104. While material 106 may in fact be no more chemically compatible with the polymer of layer 102 than would be the inorganic material of layer 104, its physical integration within the matrix of layer 102 affords strong mechanical adhesion. As shown, the surface layer 106*s* extends into the matrix of polymer 102 as a series of projections or "nails." The firmly anchored layer 106*s* is chemically compatible with inorganic layer 104 and therefore exhibits substantial adhesion to this layer.

Plate 100 may be manufactured as follows. A substrate 110, which may be metal, plastic (e.g., polyester), paper, or some other durable graphic-arts material, accepts a coating of a polymeric material to form layer 102. This polymeric material may, for example, be an acrylic polymer soluble in methyl ethyl ketone (MEK) and/or other solvents. The acrylic polymer is combined with selected multifunctional acrylate monomers and coated (cast) from solvent onto substrate 110. The multifunctional acrylate acts as a typical ester plasticizer, promoting adhesion and lowering the softening (melting) point of the polymer mixture. The ACRYLOID acrylic polymers B-44, B-72, and B-82, supplied by Rohm & Haas, represent suitable solvent-soluble acrylics; dipentaerythritolpentaacrylate (e.g., the SR-399 product supplied by Sartomer) represents a suitable multifunctional acrylate.

The substrate-borne acrylic mixture is heated to the softening point, whereupon deposition material 106 is applied to the exposed surface thereof. Material 106 may comprise one or more metals and/or metal alloys, intermetallics (i.e., two or more metals combined in a definite ratio), and/or compositions including one or more metals in combination with one or more nonmetals. Preferred nonmetals for such compositions include boron, carbon, nitrogen, oxygen, fluorine, and silicon. Material 106 may also be a hard inorganic compound such as silicon dioxide. It should be stressed that the deposition material can comprise a plurality of different substances fulfilling the foregoing criteria.

Material 106 may be applied by conventional roll (web) coating, or by intermittent-motion machines such as those employed for glass coating. Alternatively, material 106 may be applied by a vacuum coating process such as vacuum evaporation, electron-beam (EB) evaporation, or sputtering. The implementational details of such processes are well-characterized in the art. The deposition process may involve controlled cooling to withdraw the latent heat resulting from condensation of the inorganic material from the vapor phase.

With the polymer 102 still in the softened state, it may be desirable to assist the migration of inorganic material 106 into polymer 102 in order to form the projections discussed above. One approach is to statically charge the inorganic material 106 and apply an opposite charge to substrate 110.

Layer 102 is then cured, causing it to intensively crosslink and thereby "freeze" the inorganic material 106 to impart permanence. An acrylate layer 102 can be cured by EB exposure. The cured polymer exhibits substantially greater temperature resistance than the original, uncured polymer (that is, following cure, layer 102 can no longer be readily softened) and its solubility in the solvent(s) from which it was originally coated is substantially decreased, if not eliminated.

Layer 104 is then applied to the surface 106*s* (which typically includes exposed portions of layer 102, since it is generally not necessary to ensure complete coverage of layer 102 by inorganic material 106), typically by vacuum deposition. Layer 104 may, for example, be a very thin (50–500 Å, with 300 Å preferred for titanium) layer of a metal that may or may not develop a native oxide surface upon exposure to air. This layer ablates in response to IR radiation, and an image is imposed onto the plate through patterned exposure. The metal or the oxide surface thereof exhibits hydrophilic properties that provide the basis for use of this construction as a lithographic printing plate. Imagewise removal, by ablation, of layer 104 exposes surface 106*s;* if fully covered by inorganic material 106, this layer, too, may be ablated to expose the surface of composite layer 102. The ultimately exposed layer is chosen for oleophilicity; accordingly, while layer 104 accepts fountain solution, layer 102 and/or inorganic material 106 reject fountain solution but accept ink.

The metal of layer 104 in this embodiment is at least one d-block (transition) metal, aluminum, indium or tin. In the case of a mixture, the metals are present as an alloy or an intermetallic. Again, the development, on more active metals, of an oxide layer can create surface morphologies that improve hydrophilicity.

Alternatively, layer 104 may be a hard, durable, hydrophilic, metallic inorganic layer comprising a compound of at least one metal with at least one non-metal, or a mixture of such compounds. Once again, layer 104 ablatively absorbs imaging radiation, and consequently is applied at a thickness of only 100–2000 Å. The metal component of layer 104 in this form may be a d-block (transition) metal, an f-block (lanthanide) metal, aluminum, indium or tin, or a mixture of any of the foregoing (an alloy or, in cases in which a more definite composition exists, an intermetallic). Preferred metals include titanium, zirconium, vanadium, niobium, tantalum, molybdenum and tungsten. The non-metal component may be one or more of the p-block elements boron, carbon, nitrogen, oxygen and silicon. A metal/non-metal compound in accordance herewith may or may not have a definite stoichiometry, and may in some cases (e.g., Al—Si compounds) be an alloy. Preferred metal/non-metal combinations include TiN, TiON, $TiO_x$ (where $0.9 \leqq x \leqq 2.0$), TiC, and TiCN.

If desired, an additional layer 112 can be applied over layer 104 to achieve different affinity or physical characteristics. For example, layer 112 may be a silicone or fluoropolymer material that rejects ink, thereby transforming construction 100 into a dry plate. During imaging, ablation of layer 104 disrupts the anchorage of layer 112, rendering it easily removed in a post-imaging cleaning step to reveal the surface 106*s* or layer 102. Useful materials for layer 112 and techniques of coating are disclosed in U.S. Pat. Nos. 5,339,737 and Re. 35,512, the entire disclosures of which are hereby incorporated by reference. Basically, suitable silicone materials are applied using a wire-wound rod, then dried and heat-cured to produce a uniform coating deposited at, for example, 2 $g/m^2$.

A second plate embodiment is shown in FIG. 2. In this case, the construction 150 includes a graded layer 155 having a concentration of inorganic material 106 that increases with distance from substrate 110. Layer 155 is built up in successive stages as follows. A first coating 160 of polymeric material 102 is applied onto substrate 110, preferably either by vapor condensation or by coating. Particularly if layer 106 is deposited under vacuum, polymeric materials amenable to similar deposition conditions may be preferred for layer 102, allowing consecutive layers to be built up in multiple depositions within the same chamber or a linked series of chambers under common vacuum. One suitable approach is detailed in U.S. Pat. Nos. 5,440,446; 4,954,371; 4,696,719; 4,490,774; 4,647,818; 4,842,893; and 5,032,461, the entire disclosures of which is hereby incorporated by reference. In accordance therewith, an acrylate monomer is applied as a vapor under vacuum. For example, the monomer may be flash evaporated and injected into a vacuum chamber, where it condenses onto the surface. The monomer is subsequently crosslinked by exposure to actinic (generally ultraviolet, or UV) radiation or an EB source.

A related approach is described in U.S. Pat. No. 5,260, 095, the entire disclosure of which is also incorporated by reference. In accordance with this patent, an acrylate monomer may be spread or coated onto a surface under vacuum, rather than condensed from a vapor. Again, the deposited monomer is crosslinked by UV or EB exposure.

Either of these approaches may be used to apply layer 102 onto substrate 110. Moreover, their applicability is not limited to monomers; oligomers or larger polymer fragments or precursors can be applied in accordance with either technique, and subsequently crosslinked. Useful acrylate materials include conventional monomers and oligomers (monoacrylates, diacrylates, methacrylates, etc.), as described at cols. 8–10 of the '446 patent, as well as acrylates chemically tailored for particular applications. Representative monoacrylates include isodecyl acrylate, lauryl acrylate, tridecyl acrylate, caprolactone acrylate, ethoxylated nonyl phenyl acrylate, isobornyl acrylate, tripropylene glycol methyl ether monoacrylate, and neopentyl glycol propoxylate methylether monoacrylate; useful diacrylates include 1,6-hexaneciol diacrylate, tripropylene glycol diacrylate, polyethylene glycol (200) diacrylate, tetraethylene glycol diacrylate, polyethylene glycol (400) diacrylate, polyethylene glycol (600) diacrylate, propoxylated neopentyl glycol diacrylate, the IRR-214 product supplied by UCB Radcure (aliphatic diacrylate monomer), propoxylated 1,6-hexanediol diacrylate, and ethoxylated 1,6 -hexanediol diacrylate; and useful triacrylates include trimethylolpropane triacrylate (TMPTA) and ethoxylated TMPTA.

Finally, acrylate-functional or other suitable resin coatings can be applied onto substrate 110 in routine fashion (under atmospheric conditions), according to techniques well-known in the art. In one such approach, one or more acrylates are coated directly onto substrate 110 and later cured. In another approach, one or more acrylates is combined with a solvent (or solvents) and cast onto substrate 110, following which the solvent is evaporated and the deposited acrylate eventually cured. Volatile solvents, which promote highly uniform application at low coating weights, are preferred. Acrylate coatings can also include non-acrylate functional compounds soluble or dispersible into an acrylate.

Alternatives to acrylate polymers are of course possible. For example, it may be desirable to utilize an energetic organic material (such as an acetylene derivative, an azido or azide derivative, or a nitro-functional compound) that can generate gas—typically explosively—when the overlying inorganic layer 104 is heated.

After layer 160 of polymer 102 is applied but prior to curing, the inorganic filler 106 is applied onto polymer 102 in a desired ratio relative to polymer 102. In an uncured state, polymer 102 accepts inorganic material 106 in a manner analogous to a thermally softened layer as described above. Generally, it is not necessary to draw material 106 into layer 160, since layer 160 is generally quite thin. Particularly when applied by deposition techniques such as reactive sputtering, material 106 can form a pattern of patches or islands over the surface layer 160, which is then cured as set forth above.

Application of layer 160 by vapor condensation affords greater control over the pattern of deposition. Polymer 102 can be applied under conditions that do not permit coalescence and consequent film formation, thereby allowing creation of a discontinuous polymer layer. Inorganic material 106 is then deposited over the discontinuous pattern, so that the organic layer is effectively bound within the inorganic material rather than vice versa. As discussed above, application of material 106 from vapor generally requires provision for removal of the latent heat of condensation.

Following deposition and curing of layer 160, the process is repeated for subsequent layers 162, 164, 166, which are applied with different ratios of inorganic material 106 to polymer material 102. Preferably, the proportion of inorganic material increases in each stage, resulting in a graded structure with the amount of inorganic material increasing away from substrate 110 as illustrated. The composite layer 155 provides a gradual transition from an organic polymer to a mixed organic/inorganic material. The dispersed islands of inorganic material can be made to occur in "units" (grains, particles, crystals, etc.) that are one or more orders of magnitude smaller than solids traditionally dispersed in organic binders as pigments.

Alternatively, it is possible to apply layers 160–166 without individually curing each layer before applying the next one, i.e., delaying curing until the entire sequence of layers has been applied. This approach may provide efficiency and processing benefits.

Following completion of layer 155, layer 104 is applied as discussed above and, once again, an optional layer 112 can be added thereover.

It will therefore be seen that the foregoing techniques provide a basis for improved lithographic printing and superior plate constructions. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of printing comprising:

a. providing a printing member fabricated according to steps comprising:

i. depositing, onto a substrate, a mixture of a polymer precursor and a filler material comprising an inorganic compound, the polymer precursor and the filler being present in a ratio;

ii. repeating step (i) a plurality of times with an increasing amount of filler relative to the polymer precursor, thereby producing a graded structure with the amount of filler increasing away from the substrate;

iii. curing the polymer precursor; and iv. applying a layer over a surface of the structure, the layer and the surface having different affinities for at least one printing liquid selected from the group consisting of ink and an abhesive fluid for ink, the layer, but not the structure, being subject to ablative removal by exposure to laser radiation;

b. selectively exposing, in a pattern representing an image, the printing member to laser output so as to ablate selected portions of the layer, thereby directly producing an array of image features;

c. applying ink to the member; and d. transferring the ink to a recording medium.

2. The method of claim 1 wherein step (a) is repeated a plurality of times with an increasing amount of filler relative to the polymer precursor, thereby producing a graded structure with the amount of filler increasing with distance from the substrate.

3. The method of claim 1 wherein the polymer precursor and the filler material are deposited as a vapor.

4. The method of claim 1 wherein the polymer precursor and the filler material are deposited as a liquid.

5. The method of claim 1 wherein the polymer precursor is cured by crosslinking to form a matrix.

6. The method of claim 5 wherein the polymer precursor comprises an acrylic polymer combined with a multifunctional acrylate monomer, the curing step crosslinking the monomers with the polymer.

7. The method of claim 1 wherein the surface is ink-receptive and the layer is hydrophilic.

8. The method of claim 7 wherein the layer comprises a compound of at least one metal with at least one non-metal.

9. The method of claim 8 wherein the at least one non-metal is selected from the group consisting of boron, carbon, nitrogen, silicon and oxygen.

10. The method of claim 8 wherein the layer comprises at least one of (i) a d-block transition metal, (ii) an f-block lanthanide, (iii) aluminum, (iv) indium and (v) tin.

11. The method of claim 10 wherein the layer comprises titanium.

12. The method of claim 11 wherein the layer comprises at least one oxide of titanium.

13. The method of claim 11 wherein the layer comprises titanium oxynitride.

14. The method of claim 1 wherein the filler comprises a compound of at least one metal with at least one non-metal.

15. The method of claim 14 wherein the at least one non-metal is selected from the group consisting of boron, carbon, fluorine, nitrogen, oxygen and silicon.

16. The method of claim 1 wherein the substrate comprises a pigment.

17. A method of fabricating a lithographic printing plate, the method comprising:

a. depositing, onto a substrate, a mixture of a polymer precursor and a filler material comprising an inorganic compound, the polymer precursor and the filler being present in a ratio;

b. repeating step (a) a plurality of times with a different ratio;

c. curing the polymer precursor; and d. applying a layer over a surface of the structure, the layer and the surface having different affinities for at least one printing liquid selected from the group consisting of ink and an abhesive fluid for ink, the layer, but not the structure, being subject to ablative removal by exposure to laser radiation.

18. The method of claim 17 wherein step (a) is repeated a plurality of times with an increasing amount of filler relative to the polymer precursor, thereby producing a graded structure with the amount of filler increasing with distance from the substrate.

19. The method of claim 17 wherein the polymer precursor and the filler material are deposited as a vapor.

20. The method of claim 17 wherein the polymer precursor and the filler material are deposited as a liquid.

21. The method of claim 17 wherein the polymer precursor is cured by crosslinking to form a matrix.

22. The method of claim 21 wherein the polymer precursor comprises an acrylic polymer combined with a multifunctional acrylate monomer, the curing step crosslinking the monomers with the polymer.

23. The method of claim 17 wherein the surface is ink-receptive and the layer is hydrophilic.

24. The method of claim 23 wherein the layer comprises a compound of at least one metal with at least one non-metal.

25. The method of claim 24 wherein the at least one non-metal is selected from the group consisting of boron, carbon, nitrogen, silicon and oxygen.

26. The method of claim 24 wherein the layer comprises at least one of (i) a d-block transition metal, (ii) an f-block lanthanide, (iii) aluminum, (iv) indium and (v) tin.

27. The method of claim 26 wherein the layer comprises titanium.

28. The method of claim 17 wherein the layer comprises at least one oxide of titanium.

29. The method of claim 17 wherein the layer comprises titanium nitride.

30. The method of claim 17 wherein the filler comprises a compound of at least one metal with at least one non-metal.

31. The method of claim 30 wherein the at least one non-metal is selected from the group consisting of boron, carbon, fluorine, nitrogen, oxygen and silicon.

32. The method of claim 17 wherein the substrate comprises a pigment.

* * * * *